(12) United States Patent
Khachatryan et al.

(10) Patent No.: US 10,593,741 B2
(45) Date of Patent: Mar. 17, 2020

(54) FLEXIBLE DISPLAY DEVICE

(71) Applicant: Samsung Display Co., Ltd., Yongin-si, Gyeonggi-do (KR)

(72) Inventors: Hayk Khachatryan, Yongin-si (KR); Hyunwoo Koo, Yongin-si (KR); Minsung Kim, Yongin-si (KR); Taewoong Kim, Yongin-si (KR); Boik Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 15/833,885

(22) Filed: Dec. 6, 2017

(65) Prior Publication Data

US 2018/0342566 A1  Nov. 29, 2018

(30) Foreign Application Priority Data

May 26, 2017 (KR) .......................... 10-2017-0065632

(51) Int. Cl.
*H05K 1/00* (2006.01)
*H01L 21/00* (2006.01)
(Continued)

(52) U.S. Cl.
CPC .......... *H01L 27/3258* (2013.01); *B32B 27/08* (2013.01); *B32B 27/40* (2013.01);
(Continued)

(58) Field of Classification Search
CPC ........... H05K 1/00; H01L 21/00; H01L 21/16; H01L 21/36; H01L 21/44; H01L 27/14; H01L 27/32; H01L 29/04; H01L 29/08; H01L 29/22; H01L 29/24; H01L 29/786; H01L 33/00; H01L 51/05; H01L 51/52
(Continued)

(56) References Cited

U.S. PATENT DOCUMENTS 6,087,051 A * 7/2000 Shoji .................... B41M 7/0027
347/105
7,372,110 B2 * 5/2008 Hatano ................... H01L 27/12
257/379
(Continued)

FOREIGN PATENT DOCUMENTS

EP  2 837 651 A1  2/2015
JP  2005-134841 A  5/2005
(Continued)

OTHER PUBLICATIONS

Ding, Jie et al.; "Review on shear thickening fluids and applications"; Textiles and Light Industrial Science and Technology (TLIST); vol. 2; Iss. 4; Oct. 2013; pp. 161-173.
(Continued)

*Primary Examiner* — Xiaoliang Chen
(74) *Attorney, Agent, or Firm* — Lewis Roca Rothgerber Christie LLP (57) ABSTRACT

A flexible display device includes: a flexible substrate; a thin-film transistor on the flexible substrate; a passivation film covering the thin-film transistor; and a display element on the passivation film and electrically connected to the thin-film transistor. The passivation film includes a material exhibiting a shear-thickening phenomenon.

13 Claims, 8 Drawing Sheets

(51) Int. Cl.
*H01L 21/16* (2006.01)
*H01L 21/36* (2006.01)
*H01L 21/44* (2006.01)
*H01L 27/14* (2006.01)
*H01L 27/32* (2006.01)
*H01L 29/04* (2006.01)
*H01L 29/08* (2006.01)
*H01L 29/22* (2006.01)
*H01L 29/24* (2006.01)
*H01L 29/786* (2006.01)
*H01L 33/00* (2010.01)
*H01L 51/05* (2006.01)
*H01L 51/52* (2006.01)
*H05K 5/00* (2006.01)
*B65H 75/28* (2006.01)
*B32B 27/08* (2006.01)
*B32B 27/40* (2006.01)
*B65H 75/10* (2006.01)
*H01L 51/00* (2006.01)

(52) U.S. Cl.
CPC ............ *B65H 75/10* (2013.01); *B65H 75/28* (2013.01); *H01L 51/5253* (2013.01); *H05K 5/0017* (2013.01); *B32B 2307/546* (2013.01); *B32B 2457/20* (2013.01); *B65H 2701/172* (2013.01); *H01L 51/0097* (2013.01); *H01L 2251/5338* (2013.01)

(58) Field of Classification Search
USPC ...... 174/525; 257/40, 43, 57, 59, 66, 72, 79, 257/88; 438/23, 28, 30, 33, 34, 104, 151, 438/455; 313/512
See application file for complete search history.

(56) References Cited

U.S. PATENT DOCUMENTS

| | | | |
|---|---|---|---|
| 7,453,089 B2* | 11/2008 | Yamazaki | H01L 51/524 257/72 |
| 7,463,238 B2 | 12/2008 | Funkhouser et al. | |
| 7,800,099 B2* | 9/2010 | Yamazaki | H01L 51/5253 257/40 |
| 7,858,411 B2* | 12/2010 | Yamazaki | G02F 1/133305 438/30 |
| 8,907,348 B2* | 12/2014 | Miyairi | H01L 27/1225 257/72 |
| 9,098,241 B1 | 8/2015 | Cho et al. | |
| 9,936,574 B2* | 4/2018 | Rogers | A61B 5/6867 |
| 10,256,283 B2* | 4/2019 | Song | H01L 25/167 |
| 2003/0025118 A1* | 2/2003 | Yamazaki | H01L 51/529 257/79 |
| 2003/0082889 A1* | 5/2003 | Maruyama | H01L 27/1214 438/455 |
| 2003/0127651 A1* | 7/2003 | Murakami | H01L 27/3248 257/72 |
| 2006/0046336 A1* | 3/2006 | Shoji | H01L 27/3244 438/30 |
| 2006/0103773 A1* | 5/2006 | Suh | H01L 27/12 349/43 |
| 2006/0118789 A1* | 6/2006 | Suh | H01L 51/0021 257/72 |
| 2007/0102699 A1* | 5/2007 | Lee | H01L 51/105 257/40 |
| 2007/0142801 A1* | 6/2007 | Zhou | C09J 123/02 604/366 |
| 2008/0048182 A1* | 2/2008 | Hatano | H01L 27/12 257/40 |
| 2008/0057618 A1* | 3/2008 | Honda | H01L 27/1225 438/104 |
| 2009/0244456 A1 | 10/2009 | Miyazaki et al. | |
| 2010/0025675 A1* | 2/2010 | Yamazaki | H01L 29/66742 257/43 |
| 2010/0025676 A1* | 2/2010 | Yamazaki | H01L 29/78618 257/43 |
| 2010/0025677 A1* | 2/2010 | Yamazaki | H01L 27/1225 257/43 |
| 2010/0025679 A1* | 2/2010 | Yamazaki | H01L 27/1225 257/43 |
| 2010/0032665 A1* | 2/2010 | Yamazaki | H01L 29/78618 257/43 |
| 2010/0032666 A1* | 2/2010 | Yamazaki | H01L 27/1225 257/43 |
| 2010/0032667 A1* | 2/2010 | Yamazaki | H01L 29/7869 257/43 |
| 2010/0032668 A1* | 2/2010 | Yamazaki | H01L 29/78621 257/43 |
| 2010/0035379 A1* | 2/2010 | Miyairi | H01L 27/1225 438/104 |
| 2010/0051940 A1* | 3/2010 | Yamazaki | H01L 29/4908 257/43 |
| 2010/0051949 A1* | 3/2010 | Yamazaki | H01L 29/4908 257/57 |
| 2010/0102313 A1* | 4/2010 | Miyairi | H01L 27/1225 257/43 |
| 2010/0163866 A1* | 7/2010 | Akimoto | H01L 29/78606 257/43 |
| 2011/0003428 A1* | 1/2011 | Sasaki | H01L 27/1225 438/104 |
| 2011/0003429 A1* | 1/2011 | Oikawa | H01L 29/7869 438/104 |
| 2011/0003430 A1* | 1/2011 | Yamazaki | H01L 21/67109 438/104 |
| 2011/0006301 A1* | 1/2011 | Yamazaki | H01L 27/1225 257/43 |
| 2011/0008931 A1* | 1/2011 | Yamazaki | H01L 29/66969 438/104 |
| 2011/0031492 A1* | 2/2011 | Yamazaki | H01L 27/1225 257/43 |
| 2011/0053322 A1* | 3/2011 | Sasaki | H01L 29/7869 438/149 |
| 2011/0084268 A1* | 4/2011 | Yamazaki | H01L 27/1214 257/43 |
| 2011/0111558 A1* | 5/2011 | Yamazaki | H01L 21/02422 438/104 |
| 2011/0114480 A1* | 5/2011 | Yamazaki | C23C 14/3407 204/298.13 |
| 2012/0097248 A1* | 4/2012 | Uchimi | C09J 175/04 136/259 |
| 2012/0211737 A1* | 8/2012 | Maekawa | H01L 51/0018 257/40 |
| 2012/0264244 A1* | 10/2012 | Sasaki | H01L 29/7869 438/34 |
| 2012/0314399 A1 | 12/2012 | Bohn et al. | |
| 2013/0045372 A1 | 2/2013 | O'Donnell | |
| 2013/0118561 A1* | 5/2013 | Nishimoto | C08L 75/06 136/251 |
| 2013/0180882 A1 | 7/2013 | Hamers et al. | |
| 2014/0145587 A1* | 5/2014 | Yoon | H01L 21/6835 313/512 |
| 2014/0167006 A1* | 6/2014 | Kim | H01L 27/3244 257/40 |
| 2014/0175396 A1* | 6/2014 | Lee | H01L 51/56 257/40 |
| 2014/0306191 A1* | 10/2014 | Lee | H01L 27/3225 257/40 |
| 2014/0329975 A1 | 11/2014 | Swanton et al. | |
| 2015/0001490 A1* | 1/2015 | Lee | H01L 27/3262 257/40 |
| 2015/0008407 A1* | 1/2015 | Sato | H01L 51/5271 257/40 |
| 2015/0034932 A1* | 2/2015 | Choi | H01L 27/3258 257/40 |
| 2015/0076476 A1* | 3/2015 | Odaka | H01L 27/3258 257/40 |
| 2015/0090990 A1* | 4/2015 | Tsuruoka | H01L 51/0097 257/40 |

(56) References Cited

U.S. PATENT DOCUMENTS

| | | | | |
|---|---|---|---|---|
| 2015/0188080 | A1* | 7/2015 | Choi | H01L 51/56 |
| | | | | 257/88 |
| 2015/0207102 | A1* | 7/2015 | Jeong | H01L 51/5256 |
| | | | | 257/40 |
| 2015/0357387 | A1* | 12/2015 | Lee | H01L 51/0097 |
| | | | | 257/40 |
| 2016/0118451 | A1* | 4/2016 | Youn | H01L 27/3262 |
| | | | | 257/40 |
| 2016/0168425 | A1* | 6/2016 | Imoto | C08G 18/5015 |
| | | | | 428/354 |
| 2016/0226024 | A1* | 8/2016 | Park | H01L 51/5256 |
| 2016/0315227 | A1* | 10/2016 | Kang | H01L 21/7688 |
| 2017/0092708 | A1* | 3/2017 | Jeon | H01L 27/3262 |
| 2017/0179433 | A1* | 6/2017 | Nam | H01L 27/3262 |
| 2018/0114931 | A1* | 4/2018 | Tian | G01L 1/16 |
| 2018/0130972 | A1* | 5/2018 | Sonoda | H01L 27/3276 |

FOREIGN PATENT DOCUMENTS

| | | |
|---|---|---|
| KR | 10-2007-0101602 A | 10/2007 |
| WO | WO 2008/054206 A2 | 5/2008 |

OTHER PUBLICATIONS

Displaybank; "Flexible Display Technology and Market Forecast (2012-2020)"; Sample; 2012; 22pp.

Heinrich, Gert et al. "Reinforcement of elastomers"; Current Opinion in Solid State & Materials Science; 6; 2002; pp. 195-203.

Misra, Abha et al.; "Periodic Architecture for High Performance Shock Absorbing Composites"; Scientific Reports; vol. 3; 2056; pub. Jun. 24, 2013, 9pp.

Shanks, Robert et al.; "Thermoplastic Elastomers"; Thermoplastic Elastomers; 8; ISBN: 978-953-51-0346-2; 2012; InTech; 19pp.

* cited by examiner

FLEXIBLE DISPLAY DEVICE

CROSS-REFERENCE TO RELATED APPLICATION

This application claims priority to and the benefit of Korean Patent Application No. 10-2017-0065632, filed on May 26, 2017 in the Korean Intellectual Property Office, the disclosure of which is incorporated herein in its entirety by reference.

BACKGROUND

1. Field

Aspects of example embodiments of the present invention relate to a flexible display device.

2. Description of the Related Art

As kinds of display devices for visually expressing electrical signal information has been rapidly developed, various flat panel display devices having desirable characteristics, such as thinness, light weight, and low power consumption, have been introduced, and bendable or rollable flexible display devices are being studied and developed.

However, a thin, flexible display device may be easily damages or broken by external impact. To protect the display device from external impact, a plastic sheet or the like having high strength may be provided as a protective film. However, in such a case, the flexibility of the display device is reduced. Furthermore, when the display device is bent or rolled, the protective film may crack or break.

SUMMARY

Example embodiments of the present invention include a flexible display device that is flexible and impact resistant.

Additional aspects will be set forth, in part, in the description which follows and, in part, will be apparent from the description or may be learned by practice of the presented example embodiments.

According to an example embodiment, a flexible display device includes: a flexible substrate; a thin-film transistor on the flexible substrate; a passivation film covering the thin-film transistor; and a display element on the passivation film and electrically connected to the thin-film transistor. The passivation film includes a material exhibiting a shear-thickening phenomenon.

The passivation film may include at least one of a thermoplastic polyurethane comprising an ether functional group or a thermoplastic polyurethane comprising an ester functional group.

The flexible display device may further include: a sealing member on the display element; and a first protective layer on the sealing member. The first protective layer may include at least one of a thermoplastic polyurethane comprising an ether functional group or a thermoplastic polyurethane comprising an ester functional group.

The first protective layer may include: a first layer including the thermoplastic polyurethane including the ether functional group; and a second layer including the thermoplastic polyurethane including the ester functional group.

The second layer may be stacked on the first layer.

A thickness of the second layer may be greater than that of the first layer.

When an external impact is applied to the first protective layer, the second layer may exhibit the shear-thickening phenomenon before the first layer exhibits the shear-thickening phenomenon.

When an external impact is applied to the first protective layer, the Young's modulus of the first layer may be greater than that of the second layer.

According to another example embodiment, a flexible display device includes: a rolling drum; and a flexible display panel. One end of the flexible display panel is coupled with the rolling drum. The flexible display panel is configured to be wound on an outer peripheral surface of the rolling drum, and the flexible display panel includes a display layer. The display layer includes a thin-film transistor, a display element electrically connected to the thin-film transistor, and a passivation film between the thin-film transistor and the display element. The passivation film includes a material exhibiting a shear-thickening phenomenon.

The passivation film may include at least one of a thermoplastic polyurethane including an ether functional group or a thermoplastic polyurethane including an ester functional group.

The flexible display panel may further include: a sealing member sealing the display layer; and a first protective layer on the sealing member.

The first protective layer may include a transparent material exhibiting a shear-thickening phenomenon.

The first protective layer may include at least one of a thermoplastic polyurethane including an ether functional group or a thermoplastic polyurethane including an ester functional group.

The first protective layer may include a first layer and a second layer, and the first layer and the second layer may include different thermoplastic polyurethanes from each other.

The first layer may include a thermoplastic polyurethane including an ether functional group, and the second layer may include a thermoplastic polyurethane including an ester functional group.

The second layer may be stacked on the first layer.

A thickness of the second layer may be greater than that of the first layer.

The first protective layer may include a film, and the film may include an elastic polymer and a plurality of particles dispersed therein.

The flexible display panel may further include: a flexible substrate; and a second protective layer. The display layer may be on an upper surface of the flexible substrate, and the second protective layer may be on a lower surface of the flexible substrate.

The display element may include an organic light-emitting diode.

BRIEF DESCRIPTION OF THE DRAWINGS

These and/or other aspects of the present invention will become apparent and more readily appreciated from the following description of example embodiments, taken in conjunction with the accompanying drawings in which.

DETAILED DESCRIPTION

As the present disclosure allows for various changes and numerous embodiments, embodiments will be illustrated in the drawings and described, in detail, in the written description. Aspects and features of the present disclosure, and a method or methods of accomplishing these, will be apparent when referring to embodiments described with reference to the drawings. This present disclosure may, however, be embodied in many different forms and should not be construed as limited to the embodiments set forth herein.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that although the terms "first," "second," etc. may be used herein to describe various components, these components should not be limited by these terms. These terms are only used to distinguish one component from another.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. An expression used in the singular encompasses the expression of the plural, unless it has a clearly different meaning in the context.

As used herein, the singular forms "a" and "an" are intended to include the plural forms as well, unless the context clearly indicates otherwise. It will be further understood that the terms "includes," "including," "comprises," and/or "comprising" used herein specify the presence of stated features or components but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of layers and components in the drawings may be exaggerated for convenience of explanation. Because sizes and thicknesses of layers and components in the drawings are arbitrarily illustrated for convenience of explanation, the following embodiments are not limited thereto.

When a certain embodiment may be implemented differently, a specific process order may be performed differently from the described order. For example, two consecutively described processes may be performed at substantially the same time or performed in an order opposite to the described order.

Hereinafter, example embodiments will be described, in detail, with reference to the accompanying drawings. The same reference numerals are used to denote the same elements throughout.

Figure 1:
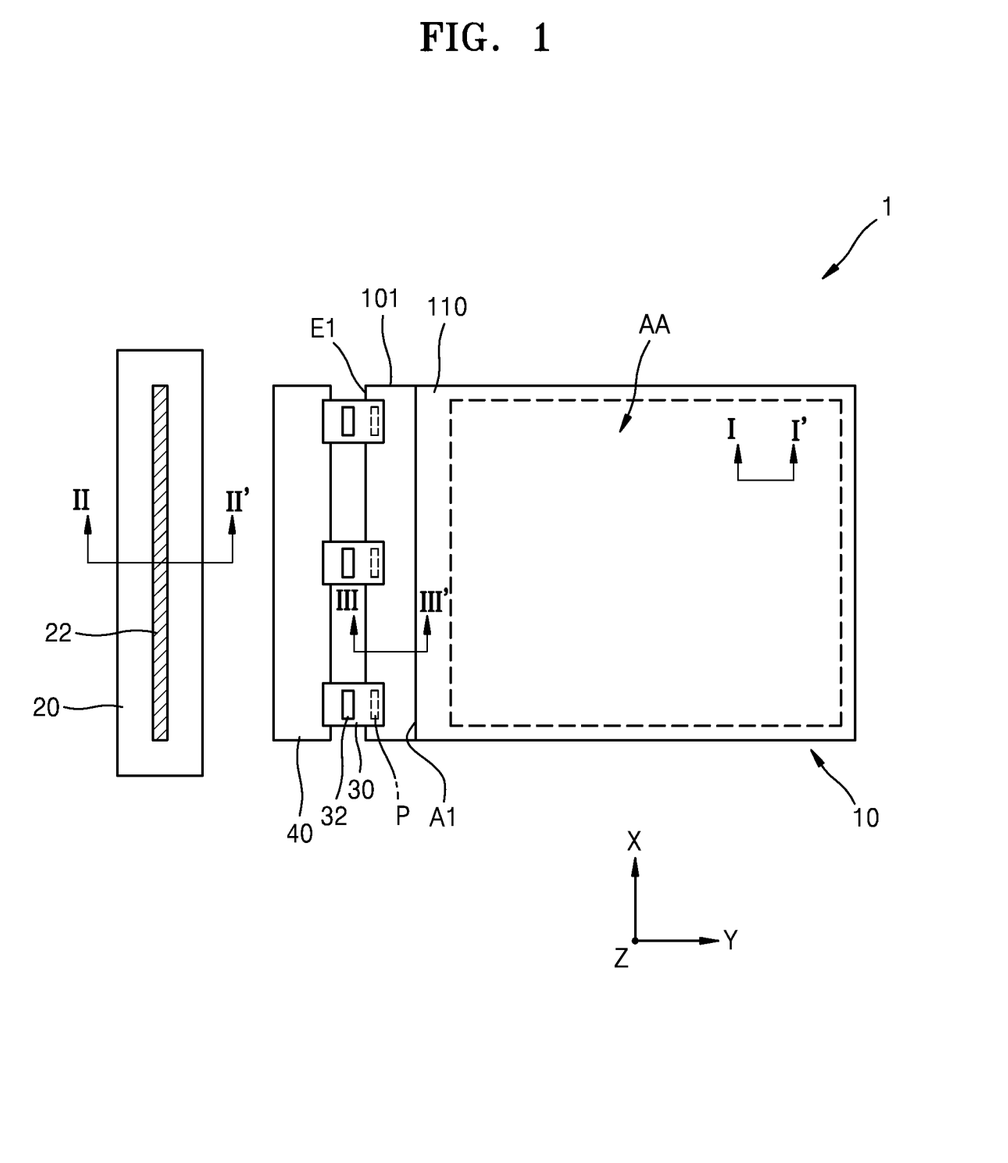
FIG. 1 is a plan view of a configuration of a flexible display device according to an embodiment of the present disclosure.
Figure 2:
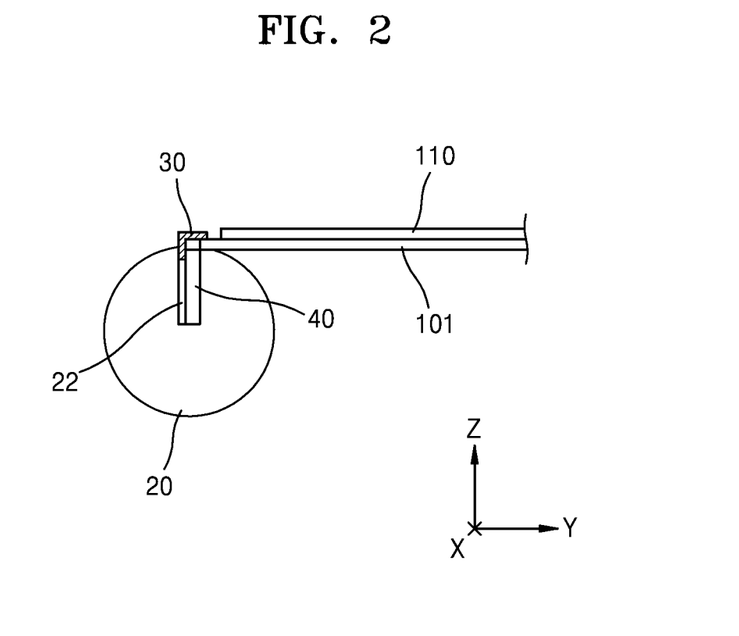
FIG. 2 is a cross-sectional view taken along the line II-II' of FIG. 1 of a flexible display panel and a rolling drum of the flexible display device in a coupled state.

FIG. 1 is a plan view of a configuration of a flexible display device 1 according to an embodiment of the present disclosure, and FIG. 2 is a cross-sectional view taken along the line II-II' of FIG. 1 of a flexible display panel and a rolling drum of the flexible display device 1 in a coupled state. FIGS. 1 and 2 show a rollable display device as an example of the flexible display device 1 according to an example embodiment of the present disclosure, but the present disclosure is not limited thereto.

Referring to FIGS. 1 and 2, according to an example embodiment of the present disclosure, the flexible display device 1 may include a rolling drum 20 and a flexible display panel 10 which is coupled with the rolling drum 20 at one end and may be wound on an outer peripheral surface of the rolling drum 20.

The flexible display panel 10 may include a flexible substrate 101 provided with a display element and a first protective layer 110 disposed on a first surface of the flexible substrate 101.

The flexible display panel 10 may be divided into a display area AA in which an image is implemented (or displayed) and a non-display area outside (e.g., surrounding a periphery of) the display area AA, and a pad portion P may be disposed in the non-display area. The pad portion P is disposed at one end of the flexible display panel 10 and is connected to a gate line and a data line to transmit a scan signal and a data signal to a display layer 200 (see, e.g., FIG. 3) through the gate line and the data line. The pad portion P is not covered by (e.g., is exposed by) the first protective layer 110. For example, the first protective layer 110 is smaller than the flexible substrate 101, and the pad portion P is between one end E1 of the flexible substrate 101 and one end A1 of the first protective layer 110.

The flexible display panel 10 further includes a circuit board 40 electrically connected to the pad portion P, and the circuit board 40 and the pad portion P may be connected to each other by a flexible circuit board 30 having an integrated circuit 32.

The rolling drum 20 includes an insertion groove 22 extending in a longitudinal direction (e.g., an X-axis direction) of the rolling drum 20. The flexible display panel 10 and the rolling drum 20 may be coupled with each other by inserting the circuit board 40 into the insertion groove 22. When the circuit board 40 is inserted into the insertion groove 22, the flexible circuit board 30 may be bent or rolled along an outer surface of the rolling drum 20 from the insertion groove 22. As a result, the flexible display panel 10 may be wound on the outer peripheral surface of the rolling drum 20 or may be released by rotation of the rolling drum 20 in a reverse direction, and the one end E1 of the flexible substrate 101 may be a winding start point.

The rolling drum 20 is installed in a housing, and the flexible display panel 10 wound on the outer peripheral surface of the rolling drum 20 may be safely stored in the housing.

Figure 3:
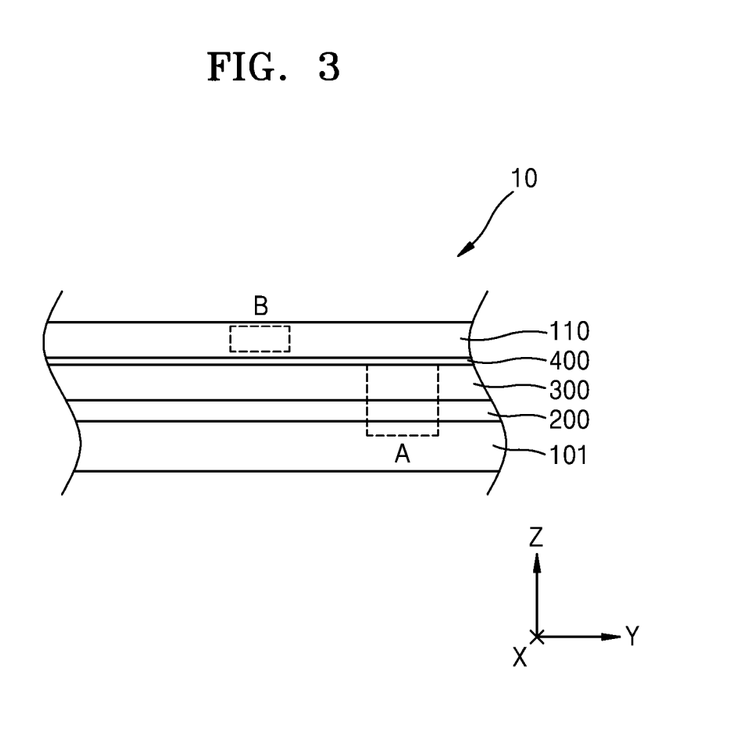
FIG. 3 is a cross-sectional view taken along the line I-I' of FIG. 1.
Figure 4:
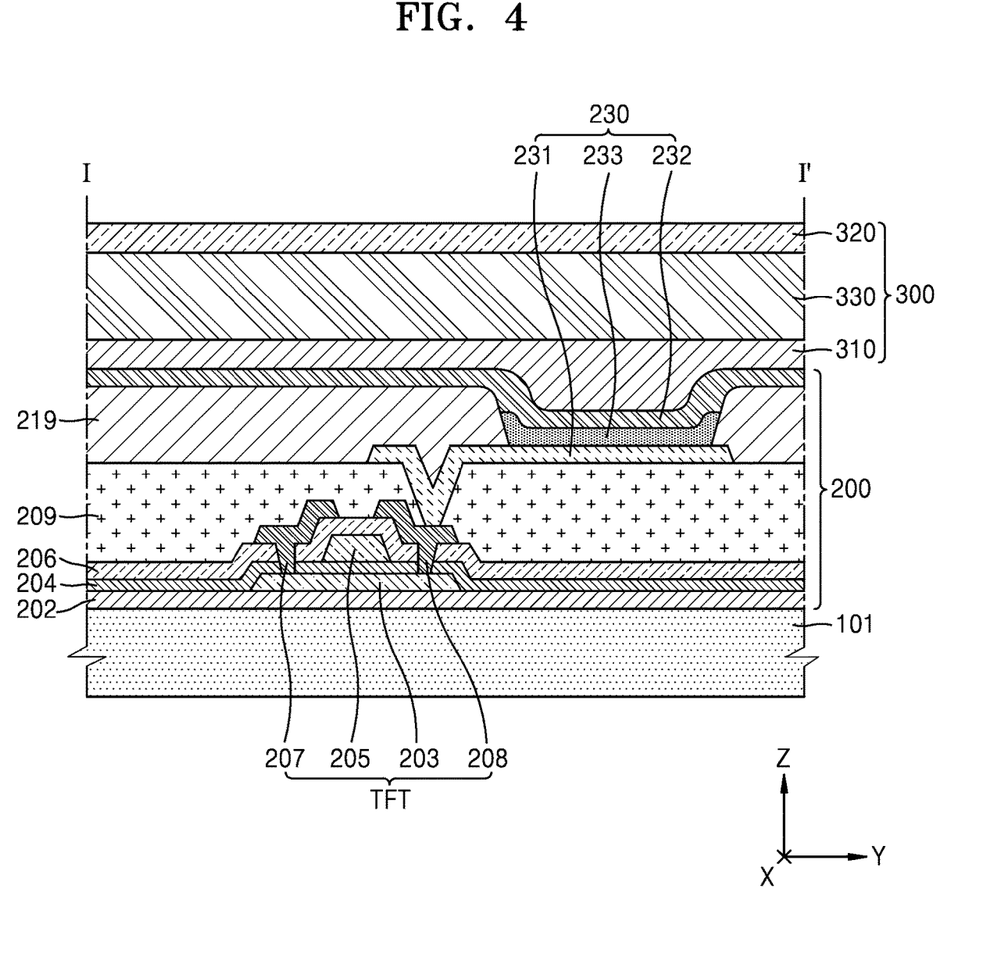
FIG. 4 is an enlarged cross-sectional view of the region A of FIG. 3.

FIG. 3 is a cross-sectional view taken along the line I-I' of FIG. 1, and FIG. 4 is an enlarged cross-sectional view of the region A of FIG. 3.

Referring to FIGS. 3 and 4, the flexible display panel 10 may include the display layer 200 formed on the flexible substrate 101, a sealing member 300 sealing the display layer 200, and the first protective layer 110. In addition, the flexible display panel 10 may further include a functional layer 400 between the sealing member 300 and the first protective layer 110.

The flexible substrate 101 has a flexible characteristic and may include various suitable materials, such as a metal material or a plastic material, such as polyethylene terephthalate (PET), polyethylene naphthalate (PEN), and/or polyimide. In some cases, a thin metal foil, such as Stainless Steel (SUS), may be used.

The display layer 200 may include a thin-film transistor TFT and a display element 230. For example, the display element 230 may be an organic light-emitting diode (OLED), but the present disclosure is not limited thereto. The display element 230 may include various kinds of light-emitting diodes.

A buffer layer 202 may be formed on a first surface of the flexible substrate 101. For example, the buffer layer 202 may include an inorganic material, such as silicon oxide ($SiO_x$), silicon nitride (SiN), silicon oxy-nitride (SiON), aluminum oxide ($Al_2O_3$), aluminum nitride (AlN), titanium oxide ($TiO_2$), and/or titanium nitride (TiON), an organic material, such as polyimide, polyester, or acryl, or a plurality of laminates of inorganic and/or organic materials.

The thin-film transistor TFT may include an active layer 203, a gate electrode 205, a source electrode 207, and a drain electrode 208. Hereinafter, it is assumed that the thin-film transistor TFT is a top-gate TFT, in which the active layer 203, the gate electrode 205, the source electrode 207, and the drain electrode 208 are sequentially formed. However, the present example embodiment is not limited thereto, and the thin-film transistor TFT may be of various suitable kinds, such as a bottom-gate TFT.

The active layer 203 may include semiconductor materials, such as amorphous silicon or polycrystalline silicon. However, the present example embodiment is not limited thereto, and the active layer 203 may include various suitable materials. In one example embodiment, the active layer 203 may include an organic semiconductor material. In another example embodiment, the active layer 203 may include an oxide semiconductor material. For example, the active layer 203 may include an oxide of a Group 12, 13, and/or 14 metal element, such as zinc (Zn), indium (In), gallium (Ga), tin (Sn), cadmium (Cd), germanium (Ge), and a combination thereof.

A gate insulating film 204 may be formed on the active layer 203. The gate insulating film 204 may include inorganic materials, such as silicon oxides and/or silicon nitrides, and may have a multilayer structure or may be a monolayer. The gate insulating film 204 insulates the active layer 203 from the gate electrode 205.

The gate electrode 205 may be formed on the gate insulating film 204. The gate electrode 205 may be connected to a gate line for applying on/off signals to the thin-film transistor TFT. The gate electrode 205 may include a low-resistance metal. For example, the gate electrode 205 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may be a monolayer or may have a multilayer structure.

An interlayer insulating film 206 may be formed on the gate electrode 205. The interlayer insulating film 206 insulates the source electrode 207 and the drain electrode 208 from the gate electrode 205. The interlayer insulating film 206 may include inorganic materials and may be a monolayer or may have a multilayer structure. For example, the inorganic materials may be metal oxides or metal nitrides, and for example, the inorganic materials may include $SiO_x$, SiN, SiON, $Al_2O_3$, $TiO_2$, hafnium oxide ($HfO_2$), and/or Zirconium dioxide ($ZrO_2$).

The source electrode 207 and the drain electrode 208 are formed on the interlayer insulating film 206. The source electrode 207 and the drain electrode 208 are formed to contact areas of the active layer 203. The source and drain electrodes 207 and 208 may include Al, Pt, Pd, Ag, Mg, Au, Ni, Nd, Ir, Cr, Li, Ca, Mo, Ti, W, and/or Cu and may be a monolayer or may have a multilayer structure. For example, the source and drain electrodes 207 and 208 may have a three-layered structure of Ti/Al/Ti.

A passivation film 209 may be formed to cover the thin-film transistor TFT. The passivation film 209 may have a flat or substantially flat upper surface and, thus, may prevent defects in the display element 230 due to a step portion (or step difference) caused by the thin-film transistor TFT.

The passivation film 209 may include a material exhibiting a shear-thickening phenomenon (e.g., a dilatant). For example, the passivation film 209 may include a silicon-based dilatant material, such as polydimethylsiloxane (PDMS). As another example, the passivation film 209 may include thermoplastic polyurethane including an ether functional group exhibiting a shear-thickening phenomenon and/or thermoplastic polyurethane including an ester functional group. However, the present disclosure is not limited thereto, and the passivation film 209 may include various suitable materials exhibiting the shear-thickening phenomenon.

Because the passivation film 209 is flexible when no stress is applied thereto, the flexible display device 1 (see, e.g., FIG. 1) may be easily bent or rolled. However, when the flexible display device 1 falls or when an external impact is applied to the flexible display device 1, the strength of the passivation film 209 increases (e.g., instantaneously increases). Thus, stress from, for example, a fall or an impact, is not transmitted to or is substantially prevented from being transmitted to the thin-film transistor TFT under the passivation film 209 and/or to the display element 230 on the passivation film 209. Therefore, the flexible display device 1 may be flexible and impact resistant.

The display element 230 is on the passivation film 209. The display element 230 may include a first electrode 231, a second electrode 232 facing the first electrode 231, and an intermediate layer 233 interposed between the first electrode 231 and the second electrode 232.

The first electrode 231 may be electrically connected to the source electrode 207 or the drain electrode 208. The first electrode 231 may have various suitable shapes.

The first electrode 231 may be formed on the passivation film 209 and may be electrically connected to the thin-film transistor TFT through a contact opening (e.g., a contact hole) formed in the passivation film 209. The first electrode 231 may be, for example, a reflective electrode. For example, the first electrode 231 may have a reflective film including Ag, Mg, Al, Pt, Pd, Au, Ni, Nd, Ir, Cr, or a compound thereof and a transparent electrode layer formed on the reflective film. The transparent electrode layer may include indium tin oxide (ITO), indium zinc oxide (IZO), zinc oxide (ZnO), indium oxide ($In_2O_3$), indium gallium oxide (IGO), and/or aluminum zinc oxide (AZO).

The second electrode 232 facing the first electrode 231 may have various suitable shapes. For example, a plurality of the second electrodes 232 may be patterned in island shapes and isolated from each other. The second electrode 232 may be a transparent electrode. The second electrode 232 may include (or may be formed of) a metal thin-film having a low work function including lithium (Li), calcium (Ca), lithium fluoride/calcium (LiF/Ca), lithium fluoride/aluminum (LiF/Al), Al, Ag, Mg, and a compound thereof. Furthermore, an auxiliary electrode layer and/or a bus electrode may be further formed on the metal thin-film, and the auxiliary electrode layer and/or the bus electrode may include a material such as ITO, IZO, ZnO, and/or $In_2O_3$. Accordingly, the second electrode 232 may transmit light emitted from an organic emission layer included in the intermediate layer 233. For example, the light emitted from the organic emission layer may be emitted directly toward the second electrode 232 or may be reflected by the first electrode 231 including the reflective electrode toward the second electrode 232.

However, the display layer 200 according to the present example embodiment is not limited to a top-emission display layer and may be, in other embodiments, a bottom-emission display layer in which light emitted by the organic emission layer is emitted toward the flexible substrate 101. In this embodiment, the first electrode 231 may include a transparent electrode, and the second electrode 232 may include a reflective electrode. In other embodiments, the display layer may be a double-sided emission display layer that emits light toward both the front and rear sides of the display layer 200.

A pixel-defining layer 219 is formed on the first electrode 231 as an insulator. The pixel-defining layer 219 may include an organic insulating material, such as polyimide, polyamide, acrylic resin, benzocyclobutene (BCB), and/or phenolic resin, and may be formed by spin coating. The pixel-defining layer 219 may expose an area (e.g., a central area) of the first electrode 231, and the intermediate layer 233 including the organic emission layer may be disposed on the exposed area of the first electrode 231. For example, the pixel-defining layer 219 defines a pixel area of an OLED.

The organic emission layer included in the intermediate layer 233 may include a low-molecular weight organic material or a high-molecular weight organic material. The intermediate layer 233 may further include, in some embodiments, a functional layer, such as a hole transport layer (HTL), a hole injection layer (HIL), an electron transport layer (ETL), and/or an electron injection layer (EIL), in addition to the organic emission layer.

The sealing member 300 for covering and sealing the display layer 200 may be formed on the second electrode 232. The sealing member 300 blocks external oxygen and moisture and may be a monolayer or may have a multilayer structure.

For example, the sealing member 300 may include an organic layer 330 and at least one of inorganic layers 310 and 320. The organic layer 330 and the inorganic layer(s) 310 and 320 may be alternately stacked. FIG. 4 illustrates an example of the sealing member 300 including the two inorganic layers 310 and 320 and the organic layer 330. However, the present disclosure is not limited thereto. For example, the sealing member 300 may further include a plurality of additional inorganic layers and/or organic layers that are alternately stacked (or arranged), but the number of the inorganic layers and the organic layers is not limited thereto.

The inorganic layers 310 and 320 may include silicon nitride ($SiN_x$), aluminum nitride (AlN), zirconium nitride (ZrN), titanium oxynitride (TiON), hafnium nitride (HfN), tantalum nitride (TaN), silicon oxide ($SiO_x$), aluminum oxide ($Al_2O_3$), titanium oxide ($TiO_2$), tin oxide ($SnO_2$), cerium oxide ($CeO_2$), and/or silicon oxynitride (SiON).

The organic layer 330 may flatten a stepped region (or step difference) of the pixel-defining layer 219 and may relieve stress generated in the inorganic layers 310 and 320. The organic layer 330 may include polymethyl methacrylate (PMMA), polycarbonate (PC), polystyrene (PS), an acrylic resin, an epoxy resin, polyimide, and/or polyethylene.

The inorganic layers 310 and 320 may be formed to have a larger area (e.g., a larger surface area) than the organic layer 330. Accordingly, the inorganic layers 310 and 320 may contact each other at an outer periphery of the organic layer 330, thereby more effectively preventing penetration of external oxygen or moisture.

The functional layer 400 may be on the sealing member 300. The functional layer 400 may include a polarizing layer and/or a touch screen layer. The functional layer 400 may further include an optical film or the like to reflect external light.

The polarizing layer transmits light emitted from the display layer 200 that oscillates in the same direction as that of a polarization axis of the polarizing layer and absorbs or reflects light oscillating in other directions. For example, the polarizing layer may include a phase-difference film which changes linearly polarized light into circularly polarized light or circularly polarized light into linearly polarized light by applying a phase difference as much as λ/4 to two perpendicularly-polarized light components, a polarizing film for separating two orthogonally-polarized light components and transmitting only one of the components and absorbing or dispersing the other component, and the like. As another example, the polarizing layer may be a wire grid polarizing layer in which a plurality of wire grids are arranged.

The touch screen layer may include a touch sensor in which first electrodes and second electrodes are alternately arranged. The touch sensor may use, for example, a capacitive method for sensing a variation in capacitance between a plurality of first electrodes and a plurality of second electrodes that cross each other to determine whether to touch is occurring at a corresponding portion or position.

A first protective layer 110 may be disposed on the functional layer 400 to protect the display layer 200 from external impact.

For example, the first protective layer 110 may be a film including an elastic polymer having excellent deformation and resilience characteristics. For example, the first protective layer 110 may include rubber, a thermoplastic olefin, a thermoplastic polyurethane, synthetic polyisoprene, polybutadiene, chloroprene rubber, butyl rubber, styrene-butadiene, polyacryl rubber, silicone rubber, a fluoroelastomer, ethylene-vinyl acetate (EVA), and the like. In some embodiments, the first protective layer 110 may include a plurality of particles therein. When a plurality of particles are dispersed in the first protective layer 110, an external impact is dispersed (or absored) by the particles, thereby preventing the external impact from being transmitted to the flexible display panel 10.

The plurality of particles may include alumina, silica, zirconium dioxide ($ZrO_2$), yttrium aluminum garnet (YAG), and/or aluminum-doped zinc oxide (AZO) with transparent properties. An average particle size of the plurality of particles may be in a range about 5 nm to about 500 nm and, in one embodiment, is in a range of about 30 nm to about 60 nm.

As another example, the first protective layer 110 may include a transparent material exhibiting a shear-thickening phenomenon. For example, the first protective layer 110 may include a thermoplastic polyurethane including an ether functional group and a thermoplastic polyurethane including an ester functional group.

Therefore, the first protective layer 110 has excellent flexibility when an external stress is not applied thereto, thereby reducing strain that occurs when the flexible display device 1 is bent or rolled. However, when an external impact is applied to the first protective layer 110, the strength (or hardness) of the first protective layer 110 increases and damage to the flexible display panel 10 may be prevented. Therefore, the flexible display device 1 (see, e.g., FIG. 1) may be flexible and be impact resistant.

The functional layer 400 may be attached to the first protective layer 110 and to the sealing member 300 by an adhesive layer. The adhesive layer may include (or may be formed of) a silicon-based adhesive or an acrylic adhesive and may further include a curing agent, a crosslinking agent, a UV stabilizer, and the like. The adhesive layer may be a pressure-sensitive adhesive (PSA), an optically clear adhesive (OCA), or the like.

Figure 5:
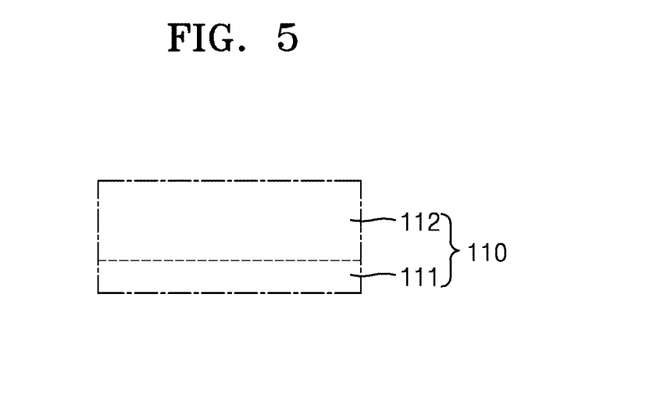
FIG. 5 is an enlarged cross-sectional view of the region B of FIG. 3.
Figure 6A:
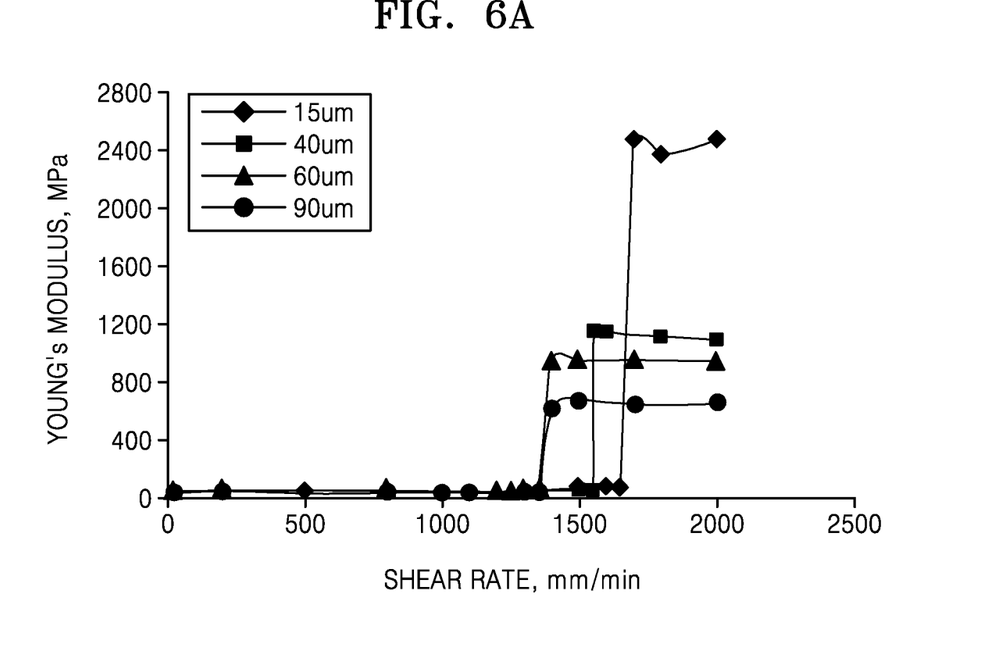
FIGS. 6A and 6B are graphs of a shear-thickening phenomena of first and second layers of FIG. 5, respectively.
Figure 6B:
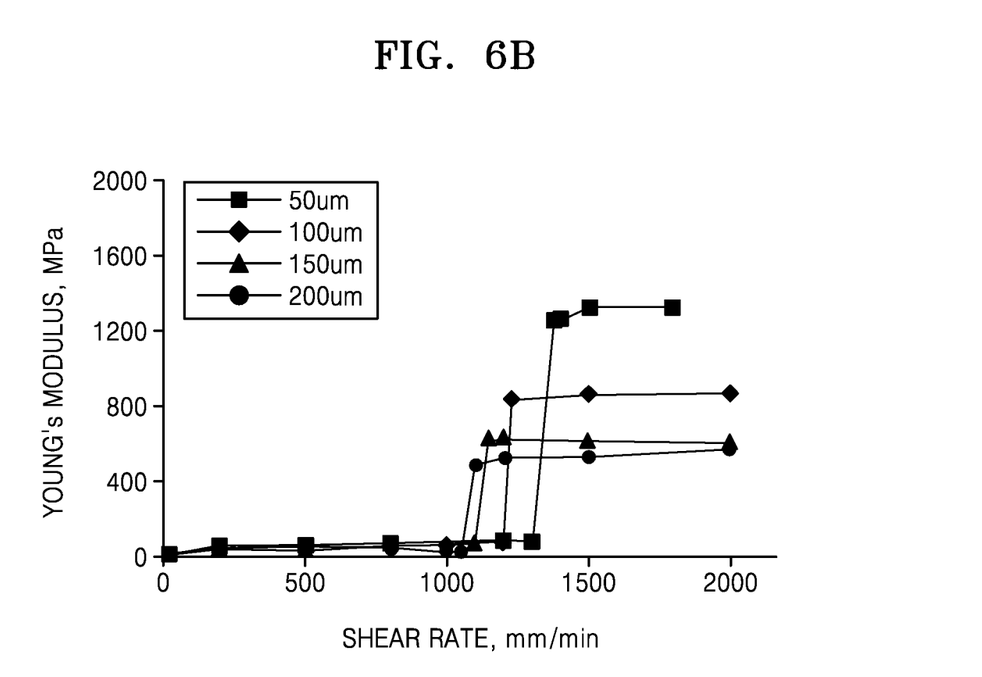
Figure 7A:
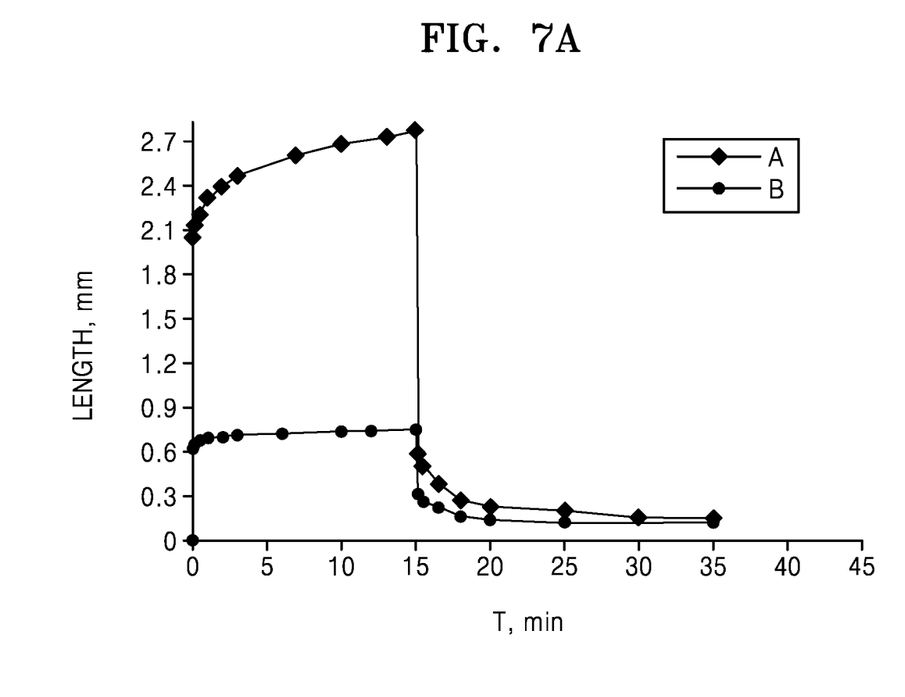
FIGS. 7A and 7B are graphs of creep and recovery curves of the first and second layers of FIG. 5, respectively.
Figure 7B:
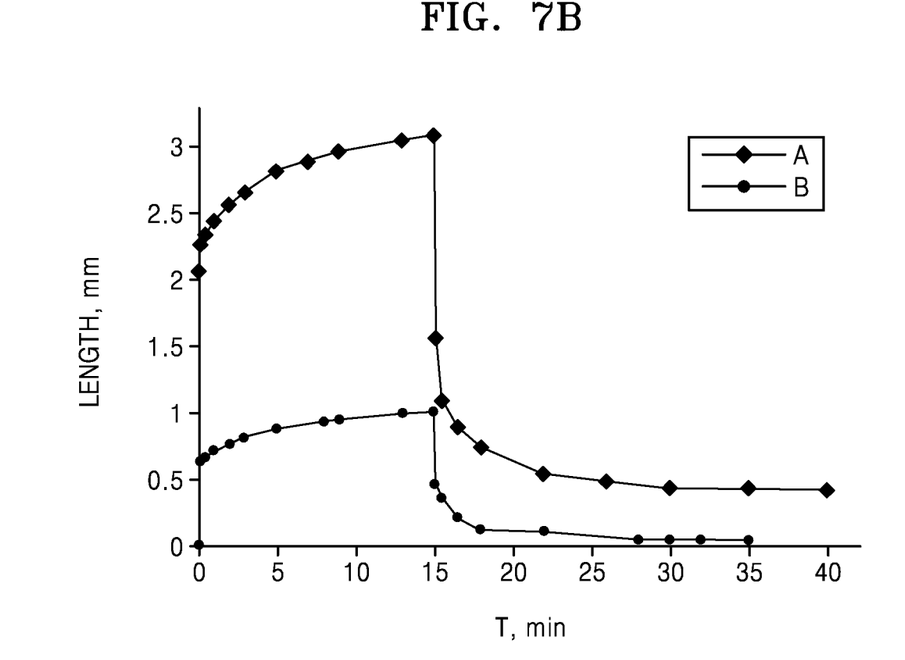
Figure 8A:
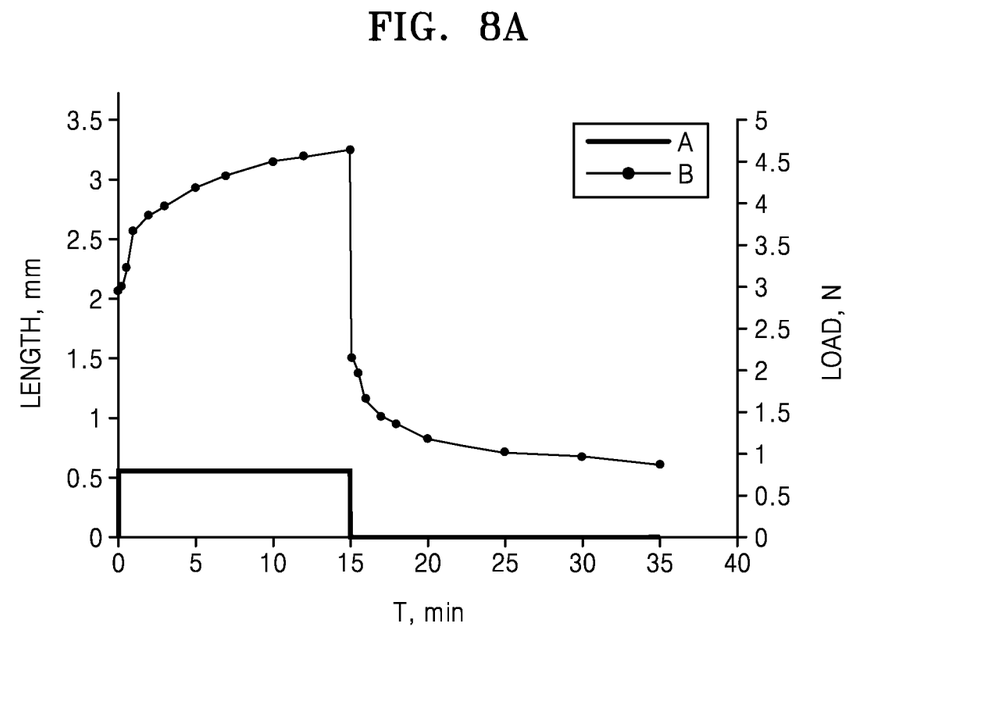
FIGS. 8A-8D are graphs of creep and recovery curves according to a thickness of the second layer of FIG. 5.
Figure 8B:
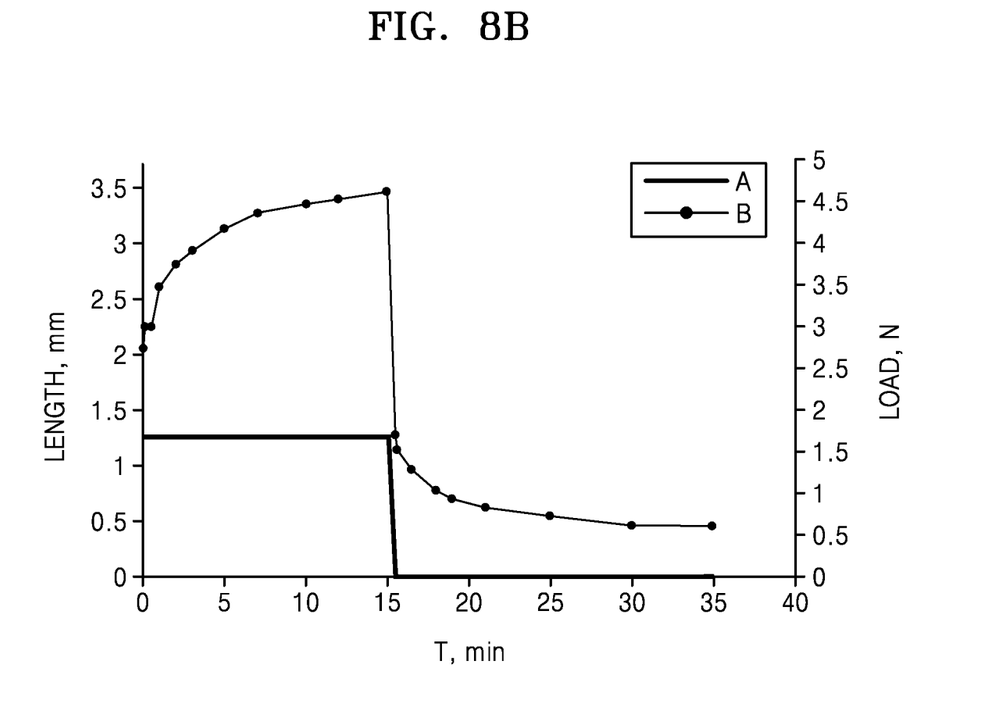
Figure 8C:
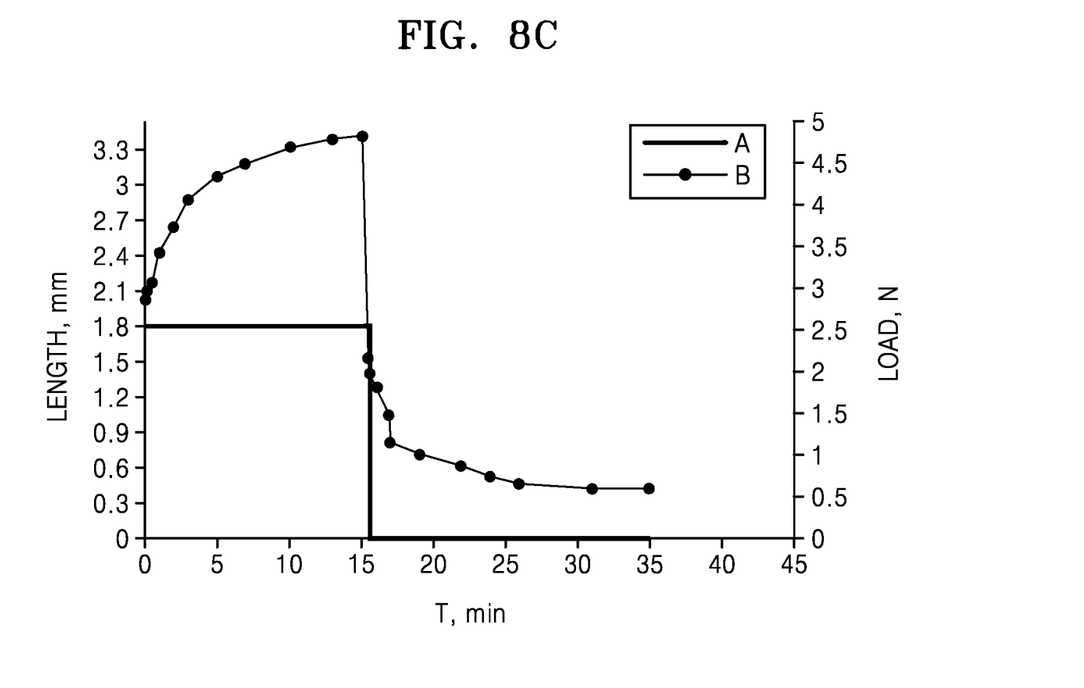
Figure 8D:
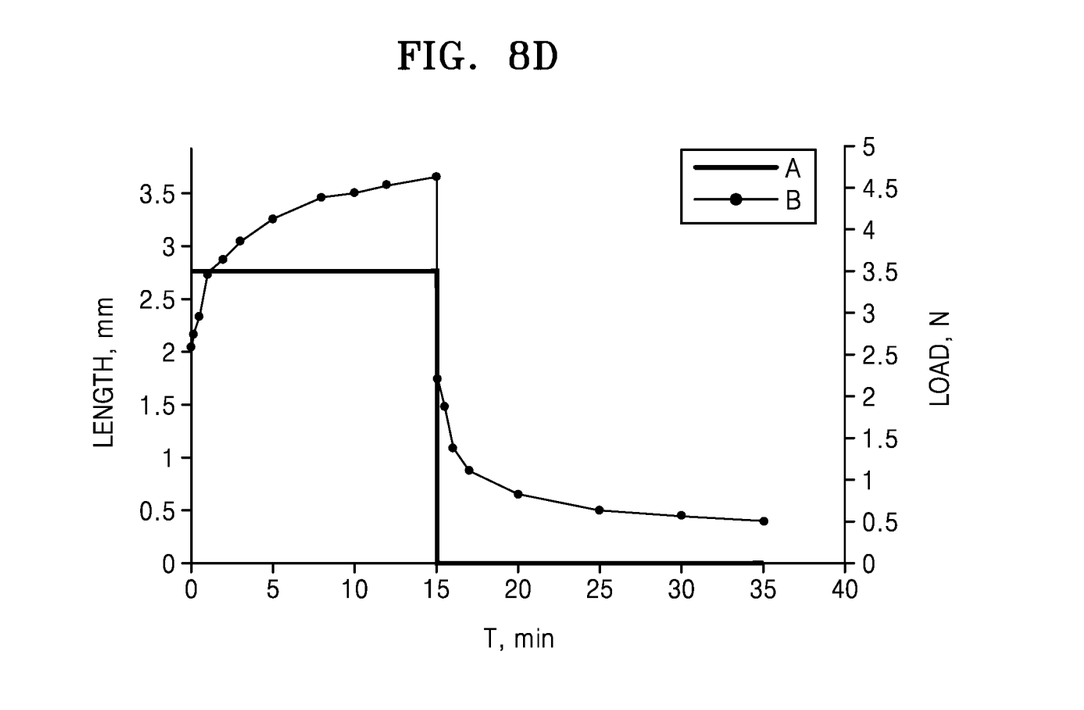

FIG. 5 is an enlarged cross-sectional view of the region B of FIG. 3, FIGS. 6A and 6B are graphs of shear-thickening phenomena of first and second layers shown in FIG. 5, respectively, FIGS. 7A and 7B are graphs of creep and recovery curves of the first and second layers shown in FIG. 5, respectively, and FIGS. 8A-8D are graphs of creep and recovery curves according to a thickness of the second layer shown in FIG. 5.

Referring to FIG. 5, the first protective layer 110 may include a first layer 111 and a second layer 112. The first layer 111 and the second layer 112 may include different thermoplastic polyurethanes. For example, the first layer 111 may include a thermoplastic polyurethane including an ester functional group, and the second layer 112 may include a thermoplastic polyurethane including an ether functional group. In addition, thicknesses of the first layer 111 and the second layer 112 may be different with respect to each other.

FIG. 6A illustrates a shear-thickening phenomenon of the first layer 111, and FIG. 6B illustrates a shear-thickening phenomenon of the second layer 112. The first layer 111 illustrated in FIG. 6A is formed of an aromatic polyester-based thermoplastic polyurethane, and the second layer 112 illustrated in FIG. 6B is formed of an aliphatic polyether-based thermoplastic polyurethane.

As shown in FIGS. 6A and 6B, the Young's modulus of the first layer 111 and the Young's modulus of the second layer 112 both increase sharply as shear rate increases. For example, both the first layer 111 and the second layer 112 may exhibit a shear-thickening phenomenon. As a result, different from when the first protective layer 110 is formed of a polymer material, such as polyimide, PET, or the like, which exhibits a shear-thinning phenomenon, the strength of the first protective layer 110 increases as shear rate increases such that the flexible display panel 10 may not be easily damaged.

FIG. 7A illustrates creep and recovery curves of the first layer 111, and FIG. 7B illustrates creep and recovery curves of the second layer 112. In FIGS. 7A and 7B, A is a result of 4.1% deformation of the first layer 111 and the second layer 112, respectively, and B is a result of 1.2% deformation of the first layer 111 and the second layer 112, respectively.

As shown in FIGS. 7A and 7B, both the first layer 111 and the second layer 112 are almost completely restored after 1.2% deformation. However, when the first layer 111 and the second layer 112 are subjected to 4.1% deformation, secondary creep of the first layer 111 is about 5.5% while secondary creep of the second layer 112 is about 13.2%, and in this case, a recovery rate of the first layer 111 is greater than that of the second layer 112. For example, the first layer 111 has greater creep resistance and greater resilience (e.g., faster reliance or recovery) than the second layer 112. Furthermore, the first layer 111 formed of a thermoplastic polyurethane including an ester functional group may have greater bonding strength with other layers below the first protective layer 110 than that of the second layer 112 formed of a thermoplastic polyurethane including an ether functional group.

However, because the first layer 111 is relatively vulnerable to moisture as compared with the second layer 112, stains and the like may occur. As shown in FIGS. 6A and 6B, the Young's modulus of the second layer 112 begins to increase at a shear rate lower than that of the first layer 111 so that the second layer 112 has a superior shear-thickening characteristic than that of the first layer 111.

Accordingly, the second layer 112 can be disposed on the first layer 111, whereby the first protective layer 110 may have an excellent shear-thickening characteristic and resilience.

FIGS. 8A-8D each illustrate creep and recovery curves according to a thickness of the second layer 112 shown in FIG. 5. FIGS. 8A-8D illustrate results of 4.1% deformation of the second layer 112. In this case, a thickness of the second layer 112 and a force N applied to the second layer 112 of Examples 1-4 corresponding to FIGS. 8A-8D are shown in Table 1 below:

TABLE 1

|  | Thickness (μm) | Force (N) | Secondary creep (%) |
|---|---|---|---|
| Example 1 | 50 | 0.8 | 18.87 |
| Example 2 | 100 | 1.7 | 13.24 |
| Example 3 | 150 | 2.5 | 12.17 |
| Example 4 | 200 | 3.5 | 10.5 |

As shown in FIGS. 8A-8D, the force N is applied to the second layer 112 of Examples 1-4 such that the second layer 112 of Examples 1-4 have an identical or substantially identical deformation rate even though the second layer 112 of Examples 1-4 have different thicknesses from each other. As shown in FIGS. 8A-8D, the recovery rate of the second layer 112 improves as the thickness thereof increases.

As described above, the second layer 112 is formed on the first layer 111 so that the second layer 112 deforms more than the first layer 111 and an external impact is applied directly to the second layer 112 when the flexible display device 1 (see, e.g., FIG. 1) is unrolled. The secondary creep of the second layer 112 may be reduced by forming a relatively thick second layer 112.

However, because the first protective layer 110 is formed to have a thickness in a range of about 50 μm to about 200 μm, the thickness of the first layer 111 may be reduced so that the second layer 112 may be formed to be relatively thick.

As shown in FIG. 6A, as the thickness of the first layer 111 is reduced, the Young's modulus sharply increases. Also, as shown in FIGS. 6A and 6B, the Young's modulus of the second layer 112 increases at a shear rate lower than that of the first layer 111. Accordingly, when an external impact is applied to the first protective layer 110, the second layer 112 first exhibits a shear-thickening phenomenon and then the first layer 111 exhibits a shear-thickening phenomenon so as to have greater strength than the second layer 112. As a result, impact resistance of the first protective layer 110 may be further enhanced.

For example, the thickness of the second layer 112 formed on the first layer 111 may be greater than the thickness of the first layer 111, whereby the first protective layer 110 may have an excellent shear-thickening characteristic, impact resistance, creep resistance, and resilience. In some embodiments, the first layer 111 may be formed to have a thickness in a range of about 5 μm to about 30 μm and the second layer 112 may have a thickness in a range of about 45 μm to about 170 μm.

Figure 9:
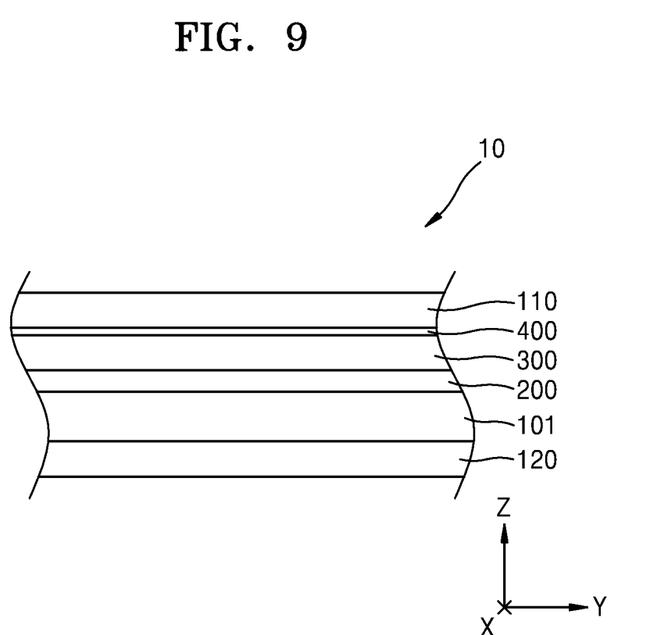
FIG. 9 is a cross-sectional view taken along the line I-I' of FIG. 1 according to another embodiment.

FIG. 9 is a cross-sectional view taken along the line I-I' of FIG. 1 according to another embodiment.

Referring to FIG. 9, the flexible display panel 10 may include the flexible substrate 101, the display layer 200, the sealing member 300, the functional layer 400, the first protective layer 110, and a second protective layer 120. Because the flexible substrate 101, the display layer 200, the sealing member 300, the functional layer 400, and the first protective layer 110 are the same or substantially the same as those described above, repeated descriptions thereof may be omitted herein.

The second protective layer 120 may be attached to a lower surface of the flexible substrate 101. Therefore, the flexible display panel 10 may not be damaged by external impacts or the like.

For example, the second protective layer 120 may include rubber, a thermoplastic olefin, a thermoplastic polyurethane, synthetic polyisoprene, polybutadiene, chloroprene rubber, butyl rubber, styrene-butadiene, polyacryl rubber, silicone rubber, a fluoroelastomer, ethylene-vinyl acetate (EVA), and the like. Furthermore, the second protective layer 120 may further include a plurality of particles dispersed therein.

The second protective layer 120 may include a material exhibiting a shear-thickening phenomenon. For example, the second protective layer 120 may include a silicon-based dilatant material, such as poly(dimethylsiloxane) (PDMS).

The second protective layer 120 may have the same or substantially the same configuration as the first protective layer 110. For example, the second protective layer 120 may include a third layer including a thermoplastic polyurethane including an ester functional group and a fourth layer including a thermoplastic polyurethane including an ether functional group. The third layer and the fourth layer may have a stacked structure, and the fourth layer may be disposed farther from the flexible substrate 101 than the third layer is.

According to example embodiments of the present disclosure, a flexible display device may be flexible and be impact resistant by including a layer including (or made of) a material exhibiting a shear-thickening phenomenon. However, the scope of the present disclosure is not limited to these aspects and features.

It should be understood that example embodiments described herein should be considered in a descriptive sense and not for purposes of limitation. Descriptions of features or aspects within each example embodiment should typically be considered as available for other similar features or aspects in other example embodiments unless explicitly described to the contrary.

While example embodiments have been described herein with reference to the figures, it will be understood by those of ordinary skill in the art that various changes in form and details may be made therein without departing from the spirit and scope as defined by the following claims and their equivalents.

What is claimed is:

1. A flexible display device comprising:
   a flexible substrate;
   a thin-film transistor on the flexible substrate;
   a passivation film covering the thin-film transistor, the passivation film comprising a material exhibiting a shear-thickening phenomenon; and
   a display element on the passivation film and electrically connected to the thin-film transistor,
   wherein the passivation film comprises at least one of a thermoplastic polyurethane comprising an ether functional group or a thermoplastic polyurethane comprising an ester functional group.

2. The flexible display device of claim 1, further comprising:
   a sealing member on the display element; and
   a first protective layer on the sealing member, the first protective layer comprising at least one of a thermoplastic polyurethane comprising an ether functional group or a thermoplastic polyurethane comprising an ester functional group.

3. The flexible display device of claim 1, further comprising a rolling drum,
   wherein one end of the flexible substrate is coupled with the rolling drum, and
   wherein the flexible substrate is configured to be wound on an outer peripheral surface of the rolling drum.

4. The flexible display device of claim 1, wherein the flexible display device further comprises a second protective layer on a lower surface of the flexible substrate.

5. The flexible display device of claim 1, wherein the display element comprises an organic light-emitting diode.

6. A flexible display device comprising:
   a flexible substrate;
   a thin-film transistor on the flexible substrate;
   a passivation film covering the thin-film transistor, the passivation film comprising a material exhibiting a shear-thickening phenomenon;
   a display element on the passivation film and electrically connected to the thin-film transistor,
   a sealing member on the display element; and
   a first protective layer on the sealing member, the first protective layer comprising at least one of a thermoplastic polyurethane comprising an ether functional group or a thermoplastic polyurethane comprising an ester functional group,
   wherein the first protective layer comprises:
      a first layer comprising the thermoplastic polyurethane comprising the ether functional group; and
      a second layer comprising the thermoplastic polyurethane comprising the ester functional group.

7. The flexible display device of claim 6, wherein the second layer is stacked on the first layer.

8. The flexible display device of claim 7, wherein a thickness of the second layer is greater than that of the first layer.

9. The flexible display device of claim 7, wherein, when an external impact is applied to the first protective layer, the second layer exhibits the shear-thickening phenomenon before the first layer exhibits the shear-thickening phenomenon.

10. The flexible display device of claim 7, wherein, when an external impact is applied to the first protective layer, the Young's modulus of the first layer is greater than that of the second layer.

11. The flexible display device of claim 6, further comprising a rolling drum,
   wherein one end of the flexible substrate is coupled with the rolling drum, and
   wherein the flexible substrate is configured to be wound on an outer peripheral surface of the rolling drum.

12. The flexible display device of claim 6, wherein the flexible display device further comprises a second protective layer on a lower surface of the flexible substrate.

13. The flexible display device of claim 6, wherein the display element comprises an organic light-emitting diode.

\* \* \* \* \*